(12) United States Patent
Chen

(10) Patent No.: US 7,335,879 B2
(45) Date of Patent: Feb. 26, 2008

(54) SYSTEM AND METHOD FOR SAMPLE CHARGE CONTROL

(75) Inventor: Zhong-Wei Chen, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 357 days.

(21) Appl. No.: 11/203,674

(22) Filed: Aug. 12, 2005

(65) Prior Publication Data

US 2006/0038126 A1    Feb. 23, 2006

Related U.S. Application Data

(60) Provisional application No. 60/602,084, filed on Aug. 16, 2004.

(51) Int. Cl.
*G01N 23/00* (2006.01)

(52) U.S. Cl. .................................. 250/310; 250/441.11

(58) Field of Classification Search ................. 250/310, 250/306
See application file for complete search history.

(56) References Cited

U.S. PATENT DOCUMENTS

| | | | | |
|---|---|---|---|---|
| 5,389,787 A | * | 2/1995 | Todokoro et al. | ........... 250/310 |
| 5,861,227 A | * | 1/1999 | Ikeda et al. | ................... 430/31 |
| 6,057,637 A | * | 5/2000 | Zettl et al. | ................... 313/310 |
| 6,853,204 B2 | * | 2/2005 | Nishiyama et al. | ......... 324/751 |
| 2003/0057971 A1 | * | 3/2003 | Nishiyama et al. | ......... 324/751 |

* cited by examiner

*Primary Examiner*—Jack I. Berman
*Assistant Examiner*—Johnnie L Smith, II
(74) *Attorney, Agent, or Firm*—Townsend and Townsend and Crew LLP

(57) ABSTRACT

A system and method for characterizing and charging a sample. The system includes a vacuum chamber, a first apparatus in the vacuum chamber and configured to characterize a sample, and a second apparatus in the vacuum chamber and configured to charge the sample. The second apparatus includes an electron gun configured to provide an electron beam to the sample and including an emission cathode biased to a first voltage relative to a reference voltage, a sample holder configured to support the sample, and a mesh located between the electron gun and the sample holder. Additionally, the second apparatus includes a first voltage supply configured to bias the mesh to a second voltage relative to the sample holder, and a second voltage supply configured to bias the sample holder to a third voltage relative to the reference voltage.

30 Claims, 5 Drawing Sheets

SYSTEM AND METHOD FOR SAMPLE CHARGE CONTROL

CROSS-REFERENCES TO RELATED APPLICATIONS

This application claims priority to U.S. Provisional Application No. 60/602,084 filed Aug. 16, 2004, which is incorporated by reference herein.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to sample preparation. More particularly, the invention provides a system and method for controlling sample charges. Merely by way of example, the invention has been applied to characterizing a sample with charged-particle beam. But it would be recognized that the invention has a much broader range of applicability.

Integrated circuit (IC) processing has become increasingly challenging as feature sizes continue to shrink. The shrinking dimensions have made many defects smaller than the resolution of optical microscopes. Consequently, other inspection techniques with higher resolutions may have to be used. For example, etch residue defects at the bottom of a contact hole often require the use of an electron-beam microscope. A type of the electron-beam microscope is scanning electron microscope.

In a scanning electron microscope, a primary beam of electrons is raster scanned over a specimen. For example, the specimen is a semiconductor wafer. The specimen interacts with the primary beam and generates secondary and backscattered electrons. Often the secondary and backscattered electrons are used to produce an image, which includes contrasts between different regions of the specimen. Various kinds of contrasts can be obtained by the scanning electron microscope, such as voltage contrast and topography contrast. For example, the voltage contrast refers to the contrast that arises from differences in electron yield of two specimen regions. The two specimen regions are at different potential levels. In another example, a specimen region appears darker on the image if an electron has to perform additional work against an existing field to escape the surface and reach the detector. In yet another example, the image of the specimen includes topography contrast that arises from differences in topography. Sharp corners can generate more electrons than rounded corners. Even with topography contrast, voltage contrast is often needed to create sufficient contrast between different regions and thus improve image quality.

Insulating materials can make up a substantial part of the specimen surface, but control of their charging is often difficult. The uncontrolled charging can creates various imaging problems such as excessive and non-uniform darkness, distortion, and arcing. One way to solve these problems is to separate surface preparation from the observation or imaging process. For example, the surface preparation is performed under relatively stronger conditions over a larger area to optimize the preparation throughput. In another example, the observation is performed under relatively milder conditions to emphasize the observation throughput and image quality.

A conventional technique for surface preparation is the use of a flood gun. The flood gun serves as a charging source to render the charges on the surface of the specimen to be similar in regions that have the same materials. But the flood gun often cannot precisely control the charge that is attained on the surface in terms of magnitude and polarity. Without additional apparatus, the flood gun is a rather non-selective tool with coarse control over charging. Another problem associated with the flood gun is the significant reduction in imaging sensitivity. For example, specimen charges deposited by the flood gun can overwhelm minor potential differences generated by weak defects.

To control specimen charging, the charges also often have to be measured accurately. For example, the charge measurement has used Kelvin probes based on Corona-oxide-semiconductor technique. But the Kelvin probes usually take up a finite amount of space and are therefore not suitable for a compact electron-beam inspection system. In the ultra-compact inspection system, the space and the column length is to be kept small and short respectively. Moreover, the high vacuum level of better than $10^{-7}$ Torr often necessitates a low overall volume of the region containing imaging optics and the specimen for ease of pumping.

Hence it is highly desirable to improve techniques for controlling sample charges.

BRIEF SUMMARY OF THE INVENTION

The present invention is directed to sample preparation. More particularly, the invention provides a system and method for controlling sample charges. Merely by way of example, the invention has been applied to characterizing a sample with charged-particle beam. But it would be recognized that the invention has a much broader range of applicability.

According to one embodiment of the present invention, a system for characterizing and charging a sample includes a vacuum chamber, a first apparatus in the vacuum chamber and configured to characterize a sample, and a second apparatus in the vacuum chamber and configured to charge the sample. The second apparatus includes an electron gun configured to provide an electron beam to the sample and including an emission cathode biased to a first voltage relative to a reference voltage, a sample holder configured to support the sample, and a mesh located between the electron gun and the sample holder. Additionally, the second apparatus includes a first voltage supply configured to bias the mesh to a second voltage relative to the sample holder, and a second voltage supply configured to bias the sample holder to a third voltage relative to the reference voltage.

According to another embodiment, an apparatus for charging a sample includes an electron gun configured to provide an electron beam to the sample and including an emission cathode biased to a first voltage relative to a reference voltage. Additionally, the apparatus includes a sample holder configured to support the sample, a mesh including a conductive grid and located between the electron gun and the sample holder, and a mesh holder configured to support the mesh. Moreover, the apparatus includes a first voltage supply configured to bias the mesh to a second voltage relative to the sample holder, and a second voltage supply configured to bias the sample holder to a third voltage relative to the reference voltage.

According to yet another embodiment, a method for charging a sample includes providing a sample on a sample holder for a scanning charged-particle microscope. The sample holder is biased to a holder voltage, and the scanning charged-particle microscope is configured to generate a charged-particle beam towards the sample and associated with a plurality of parameters including the holder voltage. Additionally, the method includes determining the holder voltage to be equal to a first voltage level. The determining the holder voltage to be equal to the first voltage level includes focusing the charged-particle beam onto the sample. Moreover, the method includes charging the sample with a plurality of charges, providing the charged sample on the sample holder for the scanning charged-particle microscope, and determining the holder voltage to be equal to a second voltage level. The determining the holder voltage to be equal to the second voltage level includes focusing the charged-particle beam onto the charged sample by adjusting the holder voltage. Also, the method includes processing information associated with the first voltage level and the second voltage level, and determining a parameter indicative of the amount of the plurality of charges on the sample based on at least information associated with the first voltage level and the second voltage level.

According to yet another embodiment, a method for charging a sample includes providing a sample on a sample holder for a scanning charged-particle microscope. The sample holder is biased to a holder voltage, and the scanning charged-particle microscope is configured to generate a charged-particle beam towards the sample and associated with a plurality of parameters including the holder voltage. Additionally, the method includes determining a first parameter to be equal to a first magnitude. The first parameter is indicative of a surface potential for the sample, and the determining a first parameter to be equal to a first magnitude includes focusing the charged-particle beam onto the sample. Moreover, the method includes charging the sample with a plurality of charges, providing the charged sample on the sample holder for the scanning charged-particle microscope, and determining the first parameter to be equal to a second magnitude. The first parameter is indicative of the surface potential for the charged sample, and the determining the first parameter to be equal to a second magnitude includes focusing the charged-particle beam onto the charged sample by adjusting the holder voltage. Also, the method includes processing information associated with the first magnitude and the second magnitude, and determining a second parameter indicative of the amount of the plurality of charges on the sample based on at least information associated with the first magnitude and the second magnitude.

Many benefits are achieved by way of the present invention over conventional techniques. For example, some embodiments of the present invention provide charge management and control during the charged-particle beam interrogation of a sample. For example, the charged-particle interrogation of the sample is the electron-beam inspection of a sample surface. Certain embodiments of the present invention can charge a sample and measure the amount of charges on the sample, in-situ, inside a vacuum chamber. For example, the charging is performed before the sample is inspected. In another example, the charging process provides a desired voltage potential on the sample surface. In yet another example, the sample charges on the sample are measured with an observation beam, such as a primary beam of a scanning electron microscope. Some embodiments of the present invention improve visibility of certain defects by providing to the sample a desirable voltage potential and/or a desirable charge profile. Certain embodiments of the present invention provide an in-situ charge measurement technique without using Kelvin probes. For example, the charge measurement is performed by the primary beam of the inspection SEM, CD-SEM, or review SEM. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and the accompanying drawings that follow.

DETAILED DESCRIPTION OF THE INVENTION

The present invention is directed to sample preparation. More particularly, the invention provides a system and method for controlling sample charges. Merely by way of example, the invention has been applied to characterizing a sample with charged-particle beam. But it would be recognized that the invention has a much broader range of applicability.

Figure 1:
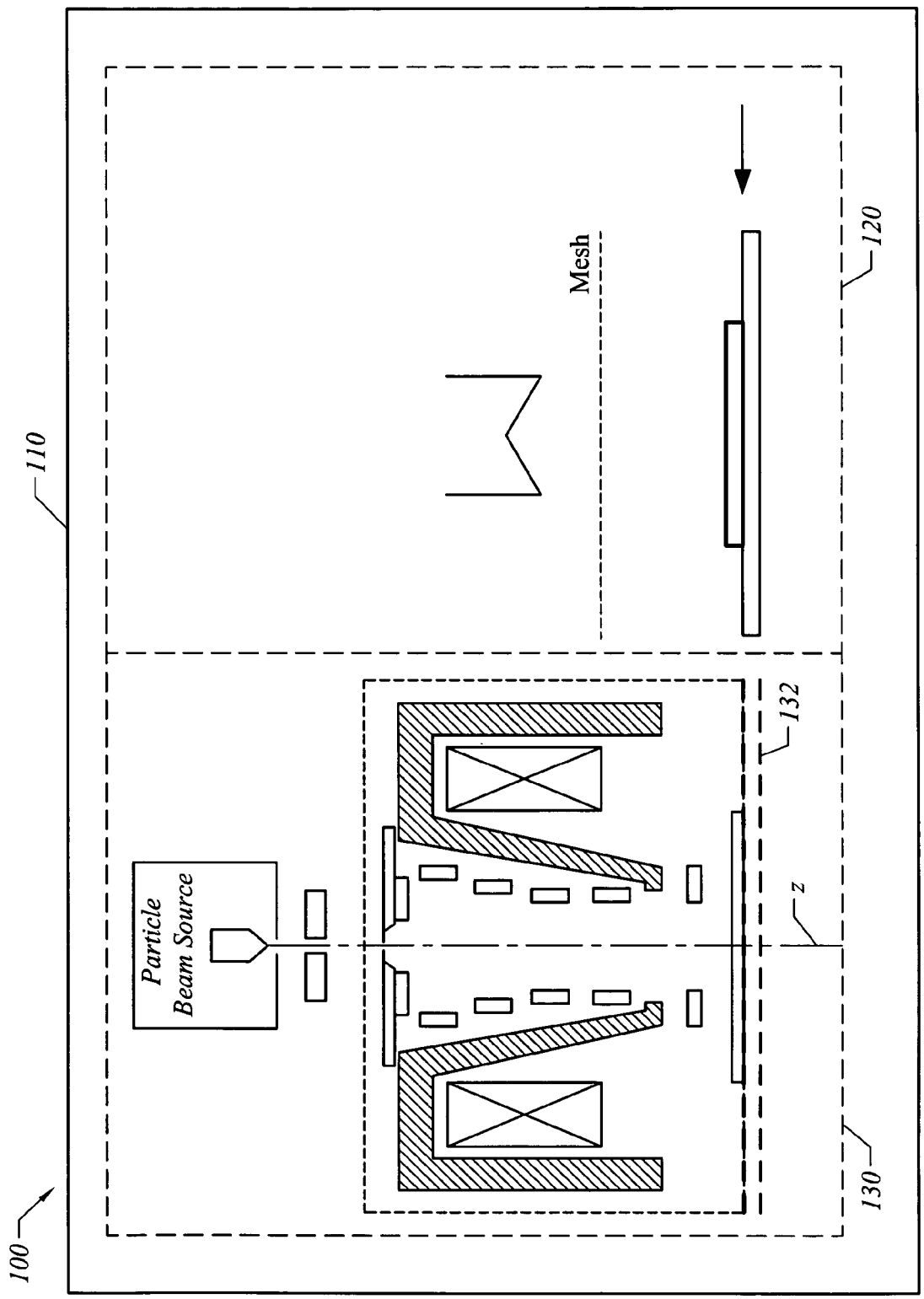
FIG. 1 is a simplified charging and characterization system according to an embodiment of the present invention.

FIG. 1 is a simplified charging and characterization system according to an embodiment of the present invention. This diagram is merely an example, which should not unduly limit the scope of the claims. One of ordinary skill in the art would recognize many variations, alternatives, and modifications. A system 100 includes a vacuum chamber 110, the charging apparatus 120, and the characterization apparatus 130. Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. For example, the characterization apparatus 130 is removed or replaced by one or more other apparatus. Further details of these components are found throughout the present specification and more particularly below.

The charging apparatus 120 and the characterization apparatus 130 are placed inside the vacuum chamber 110.

For example, the vacuum chamber 110 is configured to accept one or more samples from another apparatus or send one or more samples to another apparatus. The pressure in the vacuum chamber 110 can be controlled at a level ranging from an atmospheric pressure to $10^{-8}$ Torr. Between the charging apparatus 120 and the characterization apparatus 130, one or more samples can be transported. For example, the sample is a semiconductor wafer including components of an integrated circuit.

Figure 2:
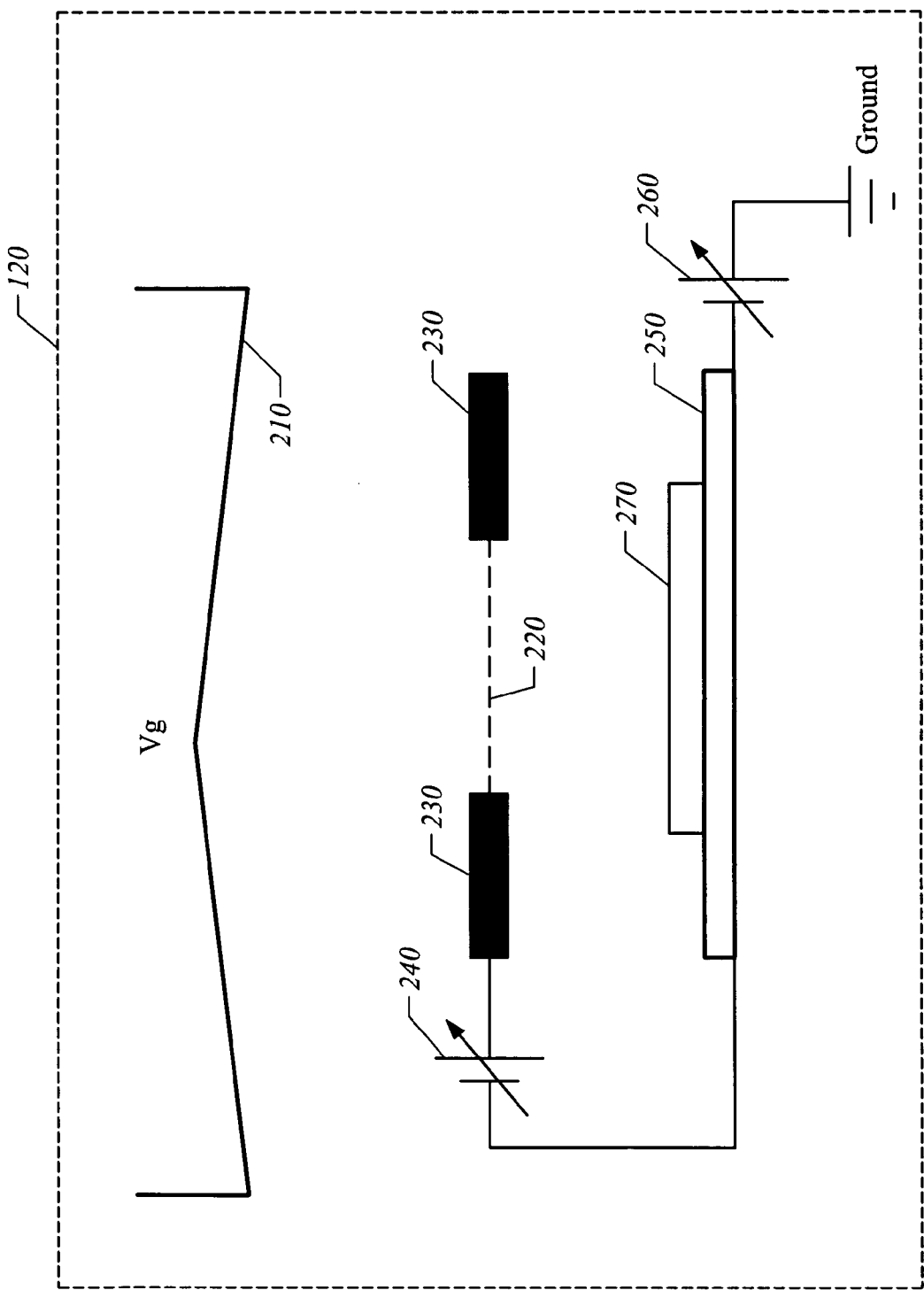
FIG. 2 is a simplified diagram showing a charging apparatus for a charging and characterization system according to an embodiment of the present invention.

FIG. 2 is a simplified diagram showing the charging apparatus 120 for the charging and characterization system 100 according to an embodiment of the present invention. This diagram is merely an example, which should not unduly limit the scope of the claims. One of ordinary skill in the art would recognize many variations, alternatives, and modifications. The charging apparatus 120 includes an electron gun 210, a mesh 220, a mesh holder 230, a mesh voltage supply 240, a sample holder 250, and a holder voltage supply 260. Although the above has been shown using a selected group of components for the apparatus 120, there can be many alternatives, modifications, and variations. For example, some of the components may be expanded and/or combined. Other components may be inserted to those noted above. For example, one or more additional electron guns are inserted. Depending upon the embodiment, the arrangement of components may be interchanged with others replaced. Further details of these components are found throughout the present specification and more particularly below.

The charging apparatus 120 is configured to accept one or more samples onto the sample holder 250, or sends one or more samples to another apparatus. In one embodiment, the one or more samples include a sample 270 located on the sample holder 250. Between the sample holder 250 and the electron gun 210, there is the mesh 220 that is supported by the mesh holder 230. In one embodiment, the electron gun 210 is a flood gun. In another embodiment, electrons from the electron gun 210 or the sample 270 have to pass through the mesh 220. In yet another embodiment, the mesh 220 includes a conductive grid with a plurality of holes. For example, the plurality of holes is rectangular. In another example, the mesh size and dimensions of the rectangular holes allow over 90% of the electrons to pass through the mesh under a set of conditions. The electrons are either emitted from the sample 270 or intended to reach the sample 270.

The electron gun 210 includes a cathode that is biased to a voltage level of $V_g$ relative to a reference voltage. For example, the reference voltage is at the ground level. The cathode can emit electrons for charging the sample 270. In one embodiment, the electrons are filtered by the mesh 220. In another embodiment, the mesh 220 accelerates or retards the electrons that are emitted from the sample 270. As shown in FIG. 2, the mesh 220 is biased by the mesh voltage supply 240 through the mesh holder 230. With respect to the sample holder 250, the mesh 220 is at a voltage level $V_m$. In yet another embodiment, the sample holder 250 is biased to a voltage level $V_s$ relative to the reference voltage by the holder voltage supply 260. In yet another embodiment, the voltage potential at the surface of the sample 270 is equal to $V_g$. In yet another embodiment, the voltage potential at the surface of the sample 270 is equal to $V_m$. In yet another embodiment, the charging apparatus 120 does not include any detector for detecting an electron from the sample 270. For example, the electron is a secondary electron, a backscatter electron, or a transmitted electron.

As discussed above and further emphasized here, the mesh 220 can serve as a controller for electrons intended to reach or escape the sample 270. The voltage level at the mesh 220 with respect to the ground level can be changed by the mesh voltage supply 240 and the holder voltage supply 260. In one embodiment, the landing energy of the electrons emitted from the electron gun 210 ranges from 0 to 5 keV. In another embodiment, the electron current for charging the sample 270 is about 1 mA.

In yet another embodiment, the voltage levels $V_g$, $V_m$, and $V_s$ can be adjusted. For example, the electron gun voltage $V_g$ ranges from −50 V to −5 kV. In another example, the mesh voltage $V_m$ ranges from −70 V to 70 V. In yet another example, the holder voltage $V_s$ ranges from $V_g$ to 0 V. In yet another example, the electron gun voltage $V_g$ ranges from −50 V to −5 kV, the mesh voltage $V_m$ is equal to 0 V, and the holder voltage $V_s$ is equal to 0 V. In yet another example, the electron gun voltage $V_g$ ranges from −50 V to −5 kV, the mesh voltage $V_m$ ranging from 0 V to 40 V, and the holder voltage $V_s$ is equal to 0 V. In yet another example, the electron gun voltage $V_g$ ranges from −50 V to −5 kV, the mesh voltage $V_m$ ranging from −40 V to 0 V, and the holder voltage $V_s$ is equal to 0 V. In yet another example, the electron gun voltage $V_g$ ranges from −50 V to −5 kV, the mesh voltage $V_m$ is equal to 0 V, and the holder voltage $V_s$ ranges from $V_g$ to $V_g$+40 V.

Returning to FIG. 1, the characterization apparatus 130 can characterize one or more samples before and/or after the samples are charged by the charging apparatus 120. For example, the characterization includes inspection, measurement, and/or review of the one or more samples. In another example, the one or more samples include a sample that is placed onto a sample holder 132. In one embodiment, the sample holder 132 is moved to and/or from the charging apparatus 120. In another embodiment, the sample holder 132 is the same as the sample holder 250.

In one embodiment, the characterization apparatus 130 includes a scanning charged particle microscope, such as a scanning electron microscope (SEM) for inspection. In another embodiment, the characterization apparatus 130 includes a CD-SEM that can measure critical dimensions of features. In yet another embodiment, the characterization apparatus 130 includes a review SEM that can provide images with higher resolutions than another electron-beam inspection system.

Figure 3:
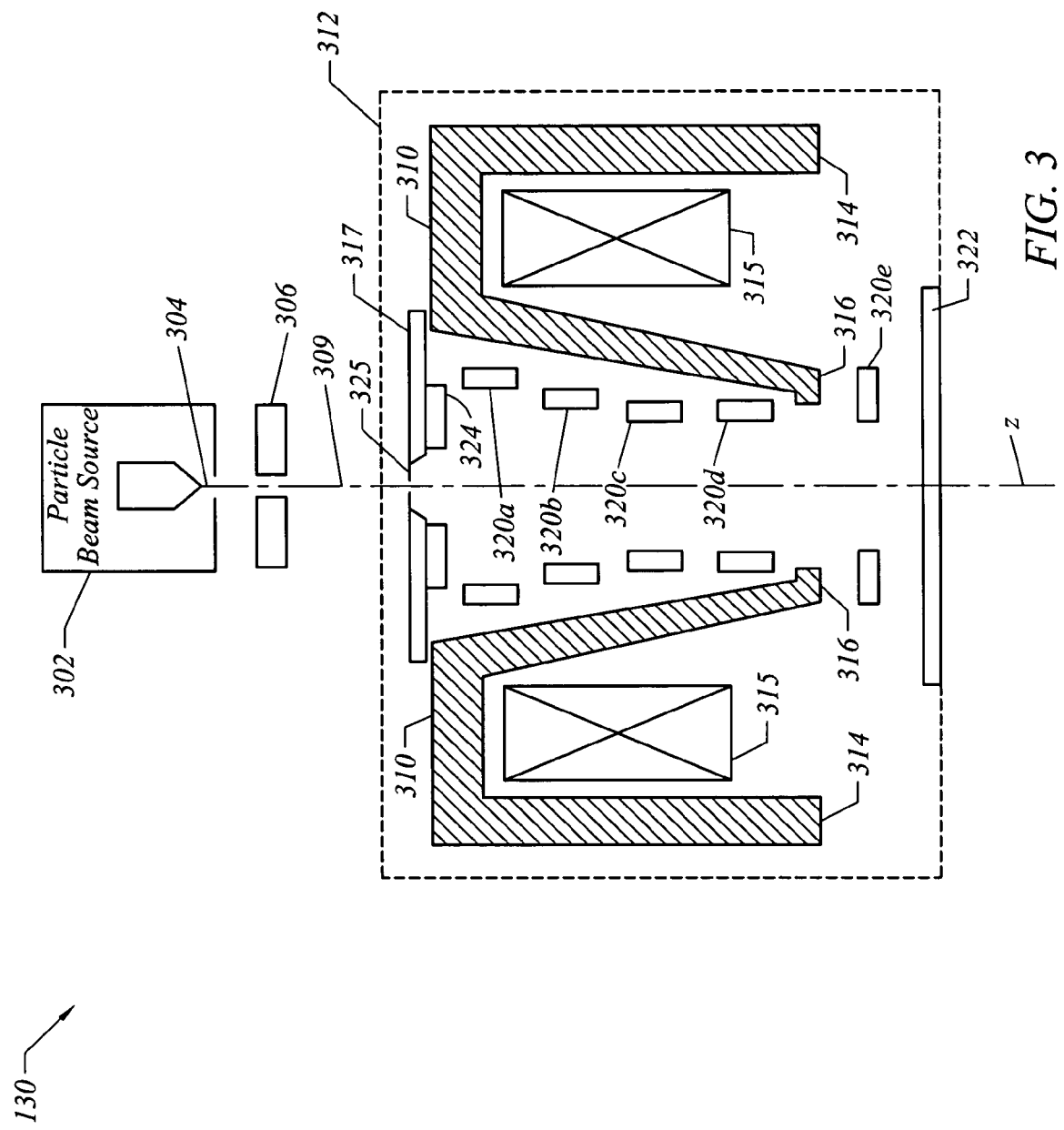
FIG. 3 is a simplified diagram showing a characterization apparatus for a charging and characterization system according to an embodiment of the present invention.

FIG. 3 is a simplified diagram showing the characterization apparatus 130 for the charging and characterization system 100 according to an embodiment of the present invention. This diagram is merely an example, which should not unduly limit the scope of the claims. One of ordinary skill in the art would recognize many variations, alternatives, and modifications. The characterization apparatus 130 is a conventional SEM system with a swinging objective retarding immersion lens. For example, the SEM system includes a charged-particle beam source 302 with an effective source point 304, an anode 306, and an objective lens system 312. The objective lens system 312 includes a magnetic lens and a plurality of deflection units 320a-320e. For reference purposes, a beam axis 309 connecting the particle beam source 302 to a sample 322 is designated the Z-axis. The X and Y axes define a plane transverse to the Z-axis.

The magnetic lens includes a magnetic material 310 and exciting coils 315. The exciting coils 315 provide a magnetomotive force to a magnetic circuit that has field lines between pole faces 314 and 316 and through the magnetic material 310. The central bore of the magnetic lens has the shape of a circular bucket which is axially symmetric about the Z-axis. At the place where the primary particle beam enters the objective lens system 312, a material 317 forms a beam-defining aperture 325. The aperture 325 determines the size of the beam allowed to enter the objective lens system 312. For example, the beam diameter is limited to a range of about 20 µm to 400 µm. Also, a lens aperture at the point where the primary particle beam exits the magnetic lens is circumscribed by pole piece face 316.

Immediately below the beam defining aperture 325 is an annular detector unit 324. The annular detector unit 324 collects secondary electrons and back-scattered electrons emitted from the sample 322. As shown in FIG. 3, the detector unit 324 includes an aperture that is larger than the beam defining aperture 325 so that the charged particles from the primary beam are not affected by the detector unit 324 as they pass through the beam defining aperture 325.

Residing in the central bore are the deflection units 320a-320d. These units are disk-shaped rings which are axially symmetric about the Z-axis. Located outside of the central bore is the deflection unit 320e which is coaxial with the Z-axis and similar in construction to the deflection units within the central bore. The objective lens system 312 focuses the particle beam into a small spot which is scanned over the sample 322 under inspection. For example, the sample 322 is a semiconductor wafer including smallest feature sizes ranging from 0.05 µm to 0.20 µm. In another example, the sample 322 is located on the sample holder 132.

As discussed above and further emphasized here, FIGS. 1-3 are merely examples, which should not unduly limit the scope of the claims. One of ordinary skill in the art would recognize many variations, alternatives, and modifications. For example, another charging apparatus is inserted into the vacuum chamber 110, so that the characterization apparatus 130 has one charging apparatus on each side. In another example, another characterization apparatus is inserted into the vacuum chamber 110, so that the charging apparatus 120 has one characterization apparatus on each side.

Figure 4:
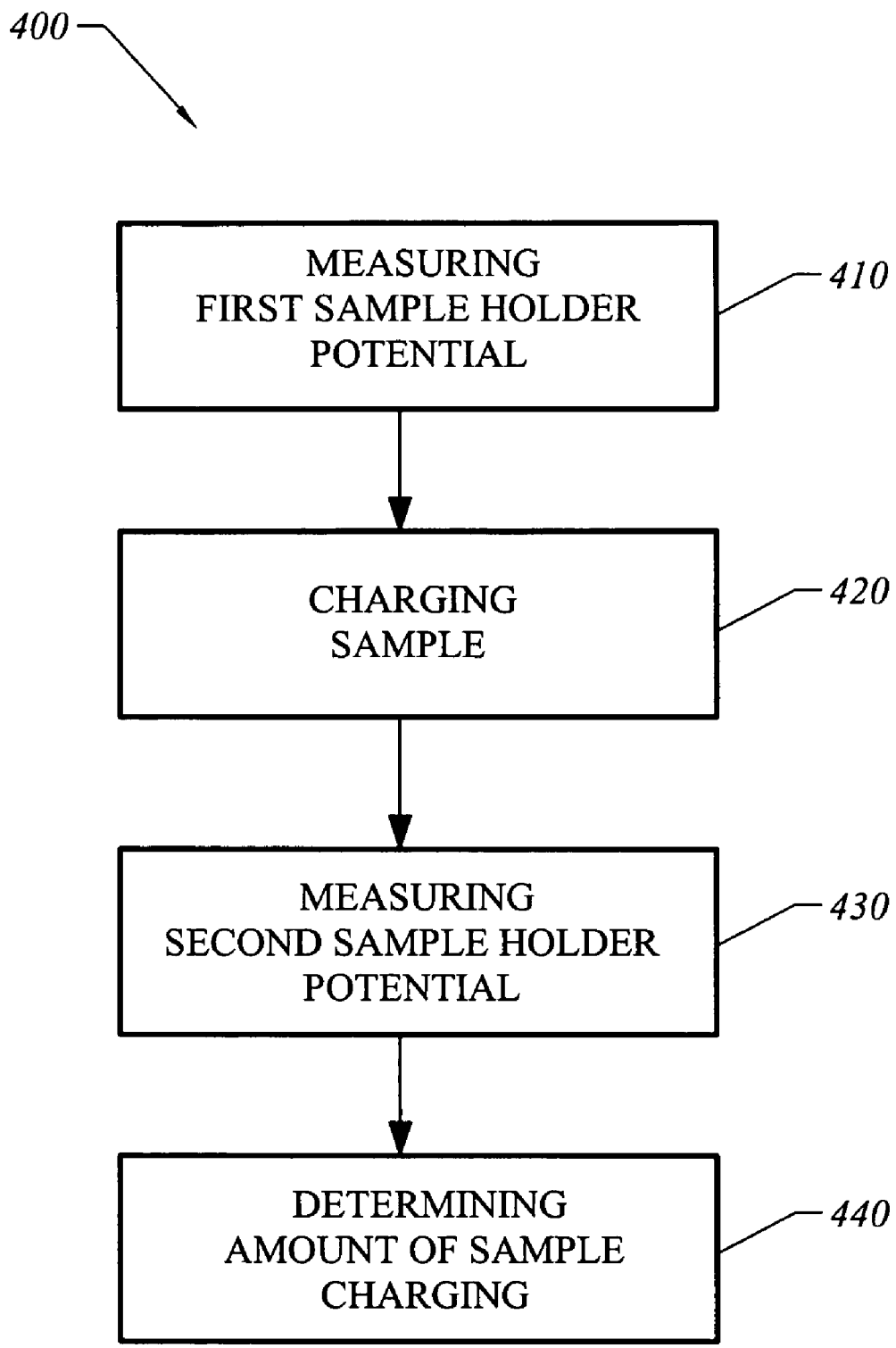
FIG. 4 is a simplified method for controlling sample charges according to an embodiment of the present invention.

FIG. 4 is a simplified method for controlling sample charges according to an embodiment of the present invention. This diagram is merely an example, which should not unduly limit the scope of the claims. One of ordinary skill in the art would recognize many variations, alternatives, and modifications. A method 400 includes a process 410 for measuring first sample holder potential, a process 420 for charging sample, a process 430 for measuring second sample holder potential, and a process 440 for determining amount of sample charging. Although the above has been shown using a selected group of processes for the method 400, there can be many alternatives, modifications, and variations. For example, some of the processes may be expanded and/or combined. Other processes may be inserted to those noted above. Depending upon the embodiment, the sequence of processes may be interchanged with others replaced. For example, the method 400 can be performed by the system 100. Further details of these processes are found throughout the present specification and more particularly below.

At the process 410, a first sample holder potential for a sample is measured. In one embodiment, a sample is placed onto the sample holder 132 of the characterization apparatus 130. The characterization apparatus 130 includes a scanning charged-particle microscope, such as a scanning electron microscope. The scanning charged-particle microscope focuses its primary charged-particle beam, such as the primary electron beam, on a selected area of the sample. After the focusing is performed, the operation parameters of the scanning charged-particle microscope are recorded. For example, the operation parameters include position parameters for the sample holder 132 such as the Z-position parameter $Z_0$. In another example, the operation parameters include the voltage potential of the sample holder 132. The voltage potential of the sample holder 132 is represented by $V_1$. In yet another example, the operation parameters include charged-particle optics parameters, such as electron optics parameters. In another embodiment, the sample used for the process 410 is not yet charged by the charging apparatus 120. In yet another embodiment, the voltage potential $V_1$ of the sample holder 132 is indicative of the surface potential of the sample 132. In yet another embodiment, the voltage potential $V_1$ of the sample holder 132 is indicative of the voltage potential of the sample 132.

At the process 420, the sample is charged with charged particles. In one embodiment, the sample is transferred from the characterization apparatus 130 to the charging apparatus 120. The charging apparatus 120 provides charges, such as electron charges, to the sample. For example, the sample is the sample 270 located on the sample holder 250. In another embodiment, the sample is transferred from the characterization apparatus 130 to another apparatus, where the sample is processes. In one embodiment, the sample is etched or deposited with the aid of a plasma.

At the process 430, a second sample holder potential for the sample is measured. In one embodiment, the sample is transferred back from the charging apparatus 120 to the characterization apparatus 130. For example, the sample is placed onto the sample holder 132 of the characterization apparatus 130. The characterization apparatus 130 includes a scanning charged-particle microscope, such a scanning electron microscope. In another example, at the process 110, the scanning charged-particle microscope focuses its primary charged-particle beam, such as the primary electron beam, on the selected area of the sample with the set of operation parameters that have been recorded. These parameters include the position parameters such as the Z-position parameter $Z_0$, the operation parameters including the voltage potential $V_1$, and the charged-particle optics parameters. At the process 430, the scanning charged-particle microscope focuses its primary charged-particle beam again on the selected area of the sample by using at least the same Z-position parameter $Z_0$ and adjusting the voltage potential of the sample holder 132. For example, the position parameters and electronic optics parameters are kept the same. After the focusing is performed, the voltage potential of the sample holder 132 is recorded and represented by $V_2$. In another embodiment, the voltage potential $V_2$ of the sample holder 132 is indicative of the surface potential of the sample 132 after the process 420. In yet another embodiment, the voltage potential $V_2$ of the sample holder 132 is indicative of the voltage potential of the sample 132 after the process 420.

At the process 440, the amount of sample charging provided by the process 430 is determined. In one embodiment, the difference between the voltage potentials $V_1$ and $V_2$ of the sample holder 132 represents the amount of sample charging. For example, $V_1-V_2$ is indicative of the amount of sample charging provided by the process 430. In another embodiment, the process 410 also includes determining whether the amount of sample charging is equal to a predetermined amount. If the amount of sample charging is insufficient, the processes 420, 430, and 440 can be repeated.

If the amount of sample charging is excessive, a process for removing charges can be performed followed by the processes 420, 430 and 440.

As discussed above and further emphasized here, FIG. 4 is merely an example, which should not unduly limit the scope of the claims. One of ordinary skill in the art would recognize many variations, alternatives, and modifications. For example, the process 440 is followed by a process for characterizing the sample. In one embodiment, the sampled is inspected by the characterization apparatus 130. In another embodiment, the sample is measured by a CD-SEM. In yet another embodiment, the sample is reviewed by a review SEM. For example, the process for characterizing the sample also includes determining the characterization quality. If the characterization quality is not high enough, at least the process 420 or a process for removing charges can be repeated or performed. In another example, the process 440 is followed by a process for processing the sample. In one embodiment, the sample is etched or deposited with the aid of a plasma.

According to another embodiment of the present invention, a system for characterizing and charging a sample includes a vacuum chamber, a first apparatus in the vacuum chamber and configured to characterize a sample, and a second apparatus in the vacuum chamber and configured to charge the sample. The second apparatus includes an electron gun configured to provide an electron beam to the sample and including an emission cathode biased to a first voltage relative to a reference voltage, a sample holder configured to support the sample, and a mesh located between the electron gun and the sample holder. Additionally, the second apparatus includes a first voltage supply configured to bias the mesh to a second voltage relative to the sample holder, and a second voltage supply configured to bias the sample holder to a third voltage relative to the reference voltage. For example, the system is implemented according to the system 100.

According to yet another embodiment, an apparatus for charging a sample includes an electron gun configured to provide an electron beam to the sample and including an emission cathode biased to a first voltage relative to a reference voltage. Additionally, the apparatus includes a sample holder configured to support the sample, a mesh including a conductive grid and located between the electron gun and the sample holder, and a mesh holder configured to support the mesh. Moreover, the apparatus includes a first voltage supply configured to bias the mesh to a second voltage relative to the sample holder, and a second voltage supply configured to bias the sample holder to a third voltage relative to the reference voltage. For example, the apparatus is implemented according to the apparatus 120.

According to yet another embodiment, a method for charging a sample includes providing a sample on a sample holder for a scanning charged-particle microscope. The sample holder is biased to a holder voltage, and the scanning charged-particle microscope is configured to generate a charged-particle beam towards the sample and associated with a plurality of parameters including the holder voltage. Additionally, the method includes determining the holder voltage to be equal to a first voltage level. The determining the holder voltage to be equal to the first voltage level includes focusing the charged-particle beam onto the sample. Moreover, the method includes charging the sample with a plurality of charges, providing the charged sample on the sample holder for the scanning charged-particle microscope, and determining the holder voltage to be equal to a second voltage level. The determining the holder voltage to be equal to the second voltage level includes focusing the charged-particle beam onto the charged sample by adjusting the holder voltage. Also, the method includes processing information associated with the first voltage level and the second voltage level, and determining a parameter indicative of the amount of the plurality of charges on the sample based on at least information associated with the first voltage level and the second voltage level. For example, the method is implemented according to the method 400.

According to yet another embodiment, a method for charging a sample includes providing a sample on a sample holder for a scanning charged-particle microscope. The sample holder is biased to a holder voltage, and the scanning charged-particle microscope is configured to generate a charged-particle beam towards the sample and associated with a plurality of parameters including the holder voltage. Additionally, the method includes determining a first parameter to be equal to a first magnitude. The first parameter is indicative of a surface potential for the sample, and the determining a first parameter to be equal to a first magnitude includes focusing the charged-particle beam onto the sample. Moreover, the method includes charging the sample with a plurality of charges, providing the charged sample on the sample holder for the scanning charged-particle microscope, and determining the first parameter to be equal to a second magnitude. The first parameter is indicative of the surface potential for the charged sample, and the determining the first parameter to be equal to a second magnitude includes focusing the charged-particle beam onto the charged sample by adjusting the holder voltage. Also, the method includes processing information associated with the first magnitude and the second magnitude, and determining a second parameter indicative of the amount of the plurality of charges on the sample based on at least information associated with the first magnitude and the second magnitude. For example, the method is implemented according to the method 400.

Figure 5:
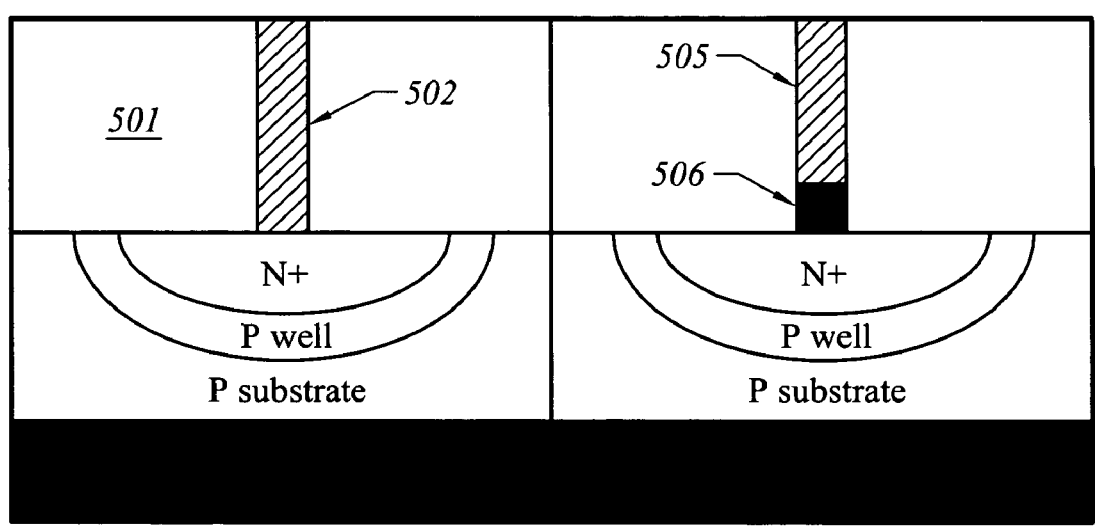
FIG. 5 is a simplified cross sectional view of a sample for electric charging according to an embodiment of the present invention.

The present invention has various applications. FIG. 5 is a simplified cross sectional view of a sample for electric charging according to an embodiment of the present invention. This diagram is merely an example, which should not unduly limit the scope of the claims. One of ordinary skill in the art would recognize many variations, alternatives, and modifications. As shown in FIG. 5, contacts 502 ad 505 each correspond to a source/drain region of an NMOS transistor in a CMOS device. The NMOS transistor resides in a p-well where the source/drain region is heavily doped to n+. For electrical connectivity, the contact 502 or 505 is made to the active n+ region. A pre-metal dielectric layer 501 is properly etched for the contact 502, which is filled with tungsten. In contrast, the pre-metal dielectric layer 501 is not properly etched for the contact 505. The contact 505 has oxide or other etch residue 506 at the bottom. The contacts 502 and 505 each are filled with tungsten that is polished by chemical mechanical polishing. Including the contact 502 and/or the contact 505, a sample is charged and inspected by the system 100 and/or the method 400. As discussed above and further emphasized here, FIG. 5 is merely an example, which should not unduly limit the scope of the claims. For example, the system 100 and/or the method 400 is used for contacts to p+ source/drain regions in a PMOS transistor. In another example, the system and/or the method 400 is used for any material on a sample such as photoresist.

In another example, the system 100 and/or the method 400 is applied to image enhancement in inspection or observation of features on a sample. In yet another example, the system 100 and/or the method 400 is applied to measurement of the critical dimensions of features on a sample. In yet another example, the system 100 and/or the method 400 is applied to providing to a sample surface a predetermined potential voltage or a predetermined charge distribution.

The present invention has various advantages over conventional techniques. Some embodiments of the present invention provide charge management and control during the charged-particle beam interrogation of a sample. For example, the charged-particle interrogation of the sample is the electron-beam inspection of a sample surface. Certain embodiments of the present invention can charge a sample and measure the amount of charges on the sample, in-situ, inside a vacuum chamber. For example, the charging is performed before the sample is inspected. In another example, the charging process provides a desired voltage potential on the sample surface. In yet another example, the sample charges on the sample are measured with an observation beam, such as a primary beam of a scanning electron microscope. Some embodiments of the present invention improve visibility of certain defects by providing to the sample a desirable voltage potential and/or a desirable charge profile. Certain embodiments of the present invention provide an in-situ charge measurement technique without using Kelvin probes. For example, the charge measurement is performed by the primary beam of the inspection SEM, CD-SEM, or review SEM.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for characterizing and charging a sample, the system comprises:
    a vacuum chamber;
    a first apparatus in the vacuum chamber and configured to characterize a sample;
    a second apparatus in the vacuum chamber and configured to charge the sample;
    wherein the second apparatus includes:
        an electron gun configured to provide an electron beam to the sample and including an emission cathode biased to a first voltage relative to a reference voltage;
        a sample holder configured to support the sample;
        a mesh located between the electron gun and the sample holder;
        a first voltage supply configured to bias the mesh to a second voltage relative to the sample holder;
        a second voltage supply configured to bias the sample holder to a third voltage relative to the reference voltage.

2. The system of claim 1 wherein the first apparatus includes a scanning electron microscope.

3. The system of claim 2 wherein the scanning electron microscope is an SEM for inspection.

4. The system of claim 2 wherein the scanning electron microscope is a review SEM.

5. The system of claim 2 wherein the scanning electron microscope is a CD-SEM.

6. The system of claim 1 wherein the vacuum chamber is associated with a chamber pressure ranging from an atmospheric pressure to $10^{-8}$ Torr.

7. The system of claim 1 wherein the mesh comprises a conductive grid including a plurality of holes.

8. The system of claim 1 wherein the first voltage ranges from −50 V to −5 kV.

9. The system of claim 1 wherein the second voltage ranges from −70 V to 70 V.

10. The system of claim 1 wherein the third voltage ranges from the first voltage to 0 V.

11. The system of claim 1 wherein the second apparatus further comprises a mesh holder configured to support the mesh.

12. An apparatus for charging a sample, the apparatus comprising:
    an electron gun configured to provide an electron beam to the sample and including an emission cathode biased to a first voltage relative to a reference voltage;
    a sample holder configured to support the sample;
    a mesh including a conductive grid and located between the electron gun and the sample holder;
    a mesh holder configured to support the mesh;
    a first voltage supply configured to bias the mesh to a second voltage relative to the sample holder;
    a second voltage supply configured to bias the sample holder to a third voltage relative to the reference voltage.

13. The apparatus of claim 12 does not include any detector for detecting an electron from the sample.

14. The apparatus of claim 13 wherein the electron is a secondary electron, a backscatter electron, or a transmitted electron.

15. The apparatus of claim 12 wherein the conductive grid includes a plurality of holes.

16. The apparatus of claim 12 wherein the first voltage ranges from −50 V to −5 kV.

17. The apparatus of claim 12 wherein the second voltage ranges from −70 V to 70 V.

18. The apparatus of claim 12 wherein the third voltage ranges from the first voltage to 0 V.

19. A method for charging a sample, the method comprising:
    providing a sample on a sample holder for a scanning charged-particle microscope, the sample holder being biased to a holder voltage, the scanning charged-particle microscope being configured to generate a charged-particle beam towards the sample and being associated with a plurality of parameters including the holder voltage;
    determining the holder voltage to be equal to a first voltage level, the determining the holder voltage to be equal to the first voltage level including focusing the charged-particle beam onto the sample;
    charging the sample with a plurality of charges;
    providing the charged sample on the sample holder for the scanning charged-particle microscope;
    determining the holder voltage to be equal to a second voltage level, the determining the holder voltage to be equal to the second voltage level including focusing the charged-particle beam onto the charged sample by adjusting the holder voltage;
    processing information associated with the first voltage level and the second voltage level;
    determining a parameter indicative of the amount of the plurality of charges on the sample based on at least information associated with the first voltage level and the second voltage level.

20. The method of claim 19 wherein the determining a parameter indicative of the amount of the plurality of charges comprises determining a difference between the first voltage level and the second voltage level, the difference being indicative of the amount of the plurality of charges.

21. The method of claim 19 wherein:
the focusing the charged-particle beam onto the charged sample is performed by adjusting the holder voltage without adjusting any other parameters of the plurality of parameters;
the plurality of parameters includes position parameters for the sample holder and charged-particle optics parameters for the charged-particle beam.

22. The method of claim 19 wherein:
the charging the sample with a plurality of charges is performed by an apparatus;
the apparatus includes:
an electron gun configured to provide an electron beam to the sample and including an emission cathode biased to a first voltage relative to a reference voltage;
a sample holder configured to support the sample;
a mesh located between the electron gun and the sample holder;
a first voltage supply configured to bias the mesh to a second voltage relative to the sample holder;
a second voltage supply configured to bias the sample holder to a third voltage relative to the reference voltage.

23. The method of claim 19 wherein the charging the sample with a plurality of charges includes performing a fabrication process on the sample.

24. The method of claim 19 wherein the charging the sample with a plurality of charges comprises transferring the sample from the scanning charged-particle microscope to an apparatus configured to charge the sample.

25. The method of claim 19 wherein the providing the charged sample on the sample holder for the scanning charged-particle microscope comprises transferring the charged sample from an apparatus configured to charge the sample to the scanning charged-particle microscope.

26. The method of claim 19, and further comprising determining whether the amount of the plurality of charges is equal to a predetermined charge amount.

27. The method of claim 19 wherein the providing a sample on a sample holder comprises providing the sample not yet charged by an apparatus configured to charge the sample.

28. The method of claim 19, and further comprising characterizing the charged sample.

29. A method for charging a sample, the method comprising:
providing a sample on a sample holder for a scanning charged-particle microscope, the sample holder being biased to a holder voltage, the scanning charged-particle microscope being configured to generate a charged-particle beam towards the sample and being associated with a plurality of parameters including the holder voltage;
determining a first parameter to be equal to a first magnitude, the first parameter being indicative of a surface potential for the sample, the determining a first parameter to be equal to a first magnitude including focusing the charged-particle beam onto the sample;
charging the sample with a plurality of charges;
providing the charged sample on the sample holder for the scanning charged-particle microscope;
determining the first parameter to be equal to a second magnitude, the first parameter being indicative of the surface potential for the charged sample, the determining the first parameter to be equal to a second magnitude including focusing the charged-particle beam onto the charged sample by adjusting the holder voltage;
processing information associated with the first magnitude and the second magnitude;
determining a second parameter indicative of the amount of the plurality of charges on the sample based on at least information associated with the first magnitude and the second magnitude.

30. The method of claim 29 wherein the first parameter is the holder voltage.

* * * * *